United States Patent [19]
Maurice et al.

[11] Patent Number: 4,783,147
[45] Date of Patent: Nov. 8, 1988

[54] ACTIVE MATRIX DISPLAY SCREEN WITHOUT SPURIOUS TRANSISTOR

[75] Inventors: Francois Maurice, Perros-Guirec; Joseph Richard, Lannion; Bruno Vinouze, Port-Blanc, all of France

[73] Assignee: C. N. E. T., Issy Les Moulineaux, France

[21] Appl. No.: 73,720

[22] Filed: Jul. 15, 1987

Related U.S. Application Data

[63] Continuation-in-part of Ser. No. 007,084, Jan. 27, 1987, Pat. No. 4,738,749.

[30] Foreign Application Priority Data

Jan. 27, 1986 [FR] France ................... 8601083

[51] Int. Cl.$^4$ ................... G02F 1/01; G09G 3/18; B44C 1/22; C23F 1/02
[52] U.S. Cl. ................... 350/333; 156/652; 156/656; 156/657; 156/659.1; 156/662; 156/667; 340/765; 340/784; 357/2; 357/4
[58] Field of Search ............ 156/651, 652, 653, 655, 156/656, 657, 659.1, 661.1, 662, 667, 607; 357/2, 4, 23.7, 71; 350/332, 333; 340/765, 784

[56] References Cited

U.S. PATENT DOCUMENTS

| 4,653,858 | 3/1987 | Szydlo et al. | 350/332 |
| 4,654,117 | 3/1987 | Aoki et al. | 156/659.1 |
| 4,665,008 | 5/1987 | Nishiura et al. | 430/314 |
| 4,689,116 | 8/1987 | Coissard et al. | 156/651 |

FOREIGN PATENT DOCUMENTS 0075651 4/1983 European Pat. Off. .
0103523 3/1984 European Pat. Off. .

OTHER PUBLICATIONS

Patents Abstracts of Japan, vol. 9, No. 181 (E-331)[1904], 26 juillet 1985; & JP-A-60 52 057 (Seiko Denshi Kogyo K. K.) 23-03-1985.

Primary Examiner—William A. Powell
Attorney, Agent, or Firm—Oblon, Fisher, Spivak, McClelland & Maier

[57] ABSTRACT

An active matrix display screen which does not include a spurious transistor. The screen includes a matrix of pixels with addressing columns and rows. The addressing rows consist of a stack of semiconductive material, insulating material and conductive material. Where the addressing rows cover conductive segments, a matrix of transistors is formed.

5 Claims, 3 Drawing Sheets

ACTIVE MATRIX DISPLAY SCREEN WITHOUT SPURIOUS TRANSISTOR

CROSS-REFERENCE TO RELATED APPLICATIONS

This is a continuation-in-part of application No. 07/007,084, filed on Jan. 27, 1987, now U.S. Pat. No. 4,738,749.

BACKGROUND OF THE INVENTION

1. Field of the Invention

This invention has as its object a active matrix display screen without spurious transistor.

2. Discussion of Background

An active matrix display screen generally comprises two plates between which is inserted an electrooptical material such as a liquid crystal. On one of the plates is a matrix of transparent conductive blocks, thin-film transistors, a family of conductive addressing lines and a family of conductive addressing columns. Each transistor has a gate connected to a line, a source connected to a block and a drain connected to a column. On the second plate is a counterelectrode.

Such a structure is shown in FIG. 1. Represented there in a simplified manner is a lower plate 10 carrying conductive columns 12 and conductive lines 14, transistors 20 and conductive blocks 22, and an upper plate 24 covered with a counterelectrode 26.

To obtain such a structure, a process can be used whose main stages are illustrated in FIG. 2. This process comprises the following operations:

preparation of a glass substrate 30 by physicochemical cleaning, depositing of a layer 32 of transparent conductive material, for example of indium and tin oxide (ITO) (part a), a first photoengraving, to give layer 32 the shape of columns 34 and of blocks 36 provided with a rectangular appendix 38 (part b), depositing of a hydrogenated amorphous silicon layer 40, a silica layer 42 and an aluminum layer 44, each depositing being made at abaout 250° C. (or more if the CVD-plasma technique is used (part c), a second photoengraving, to define lines 46 overlapping appendices 38 and intersecting the columns, which defines the transistors (part d), general passivation by depositing of a SiO$_2$ layer (not shown).

Such a process, with two masking levels, is described in French patent application FR-A-2 533 072.

Despite its simplicity, this process exhibits a drawback which is the following.

By leaving present, for each line, the metal-insulation-(a-Si:H) stack, a spurious transistor is created between each pixel and the column located on the right. Now, a pixel should receive viedeo information only from the column located on its left, and not from the column located on its right. With a spurious transistor, this condition will not be met and a pixel will be able to receive a video information coming from the column located on its right. But, as noted in the patent cited above, the current passing through the spurious transistor is much weaker than the one which passes through the main transistor, when the lengths of the channels of the transistors are very different. Actually, the current flowing in a transistor is inversely proportional to the length of its channel. When these channels have for length 10 microns for the main transistor and 200 microns for the spurious transistor, respectively, the stray current represents only 5% of the main current when the voltages on the two adjacent columns are equal.

However, the presence of the spurious transistor cannot be ignored in the case of display screens with a very slight step and especially in the case of screens intended for the display of alphagraphic characters in which the borders between the black zones and the white zones are very abrupt and frequent. Actually, in this case, opposite information can be found from one pixel to another and it is then necessary to compare the stray current coming from the right column to a zero (or very small) current coming from the left column. The stray current can then no longer be negligible in comparison with the main current.

In this case, the spurious voltage induced in the pixel should remain lower than the threshold voltage of the liquid crystal.

Here, therefore, a first difficulty is encountered.

A second difficulty relates to the transient states.

A stray capacitance (Cp) exists between a line and a pixel. At the rising and falling edges of the signal applied to a line, this capacitance causes a spurious voltage $\Delta Vp$ to appear at the terminals of the liquid crystal:

$$\Delta Vp = \Delta V_g - \frac{Cp}{Cp/C_{LC}}$$

where $C_{LC}$ designates the capacitance of the pixel and Vg the amplitude of the control pulse. The spurious pulse corresponding to the rising edge is not bothersome because the final voltage at the terminals will, in any case, be the video voltage imposed by the conducting transistor. On the other hand, at the falling edge, the transistor is blocked and the spurious charges can no longer flow into the transistor; therefore, a spurious negative voltage appears. Actually, in addition to the geometric capacitance corresponding to the gate-source overlap, it is necessary to take into acount the reserve of electrons constituted by the spurious channel (to the right of the pixel) which, during the passage to the blocking state, will flow toward the pixel and create a considerable flow of electrons.

To avoid this spurious transistor, additional engravings of the insulation-(a-Si:H) stack can always be performed to eliminate the spurious channel, while keeping a conductive line. But this would complicate the process of making the device by increasing the number of engravings.

BRIEF DESCRIPTION OF THE DRAWINGS

In any case, the characteristics of the invention will come out better on reading the following description of examples of embodiment given by way of explanation and that are in no way limiting. This description refers to the accompanying drawings in which.

DESCRIPTION OF THE PREFERRED EMBODIMENT

Figure 1:
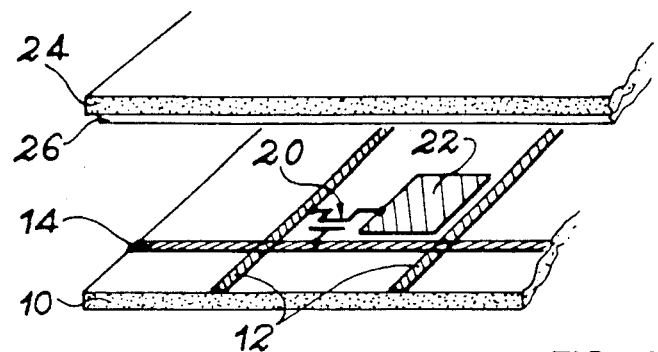
FIG. 1, already described, shows the structure of an active matrix display screen, according to the prior art, FIG. 2(a–d) already described, illustrates a known production process used to produce an active matrix display screen.
Figure 2:
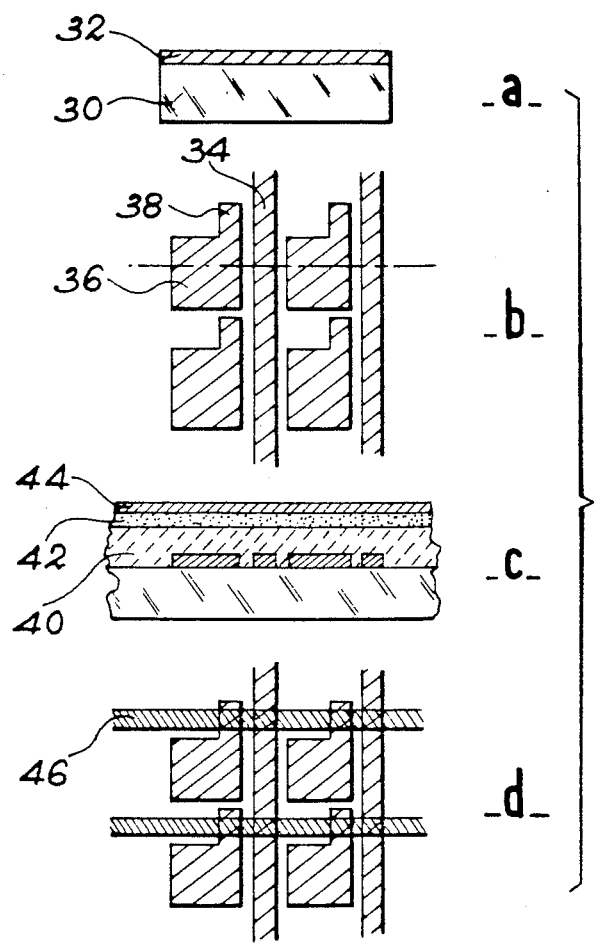
Figure 3:
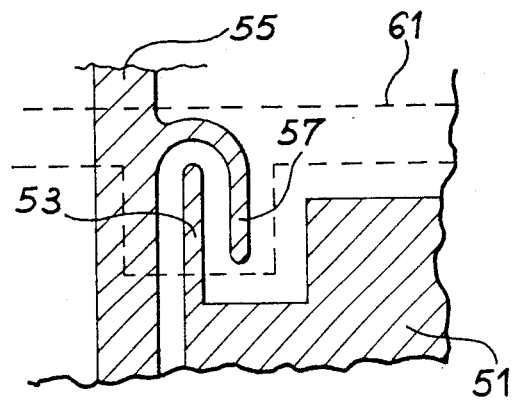
FIG. 3 illustrates a process for making the display of the invention, FIG. 4(a–f) illustrates various embodiments of the invention.

FIG. 3 illustrates a process with two photoengravings. The operations to be accomplished begin by a depositing on an insulating substrate, of a layer of a transparent conductor, ITO for example, surmounted by a layer of n doped amorphous silicon. Then a first photoengraving is performed to form blocks 51, with an appendix 53, columns 55 with an appendix 57 (in solid line in FIG. 3). Then, a stack constituted by a layer of hydrogenated amorphous silicon, a layer of a first insulating material, and a metal layer are deposited. This stack is the object of a second photoengraving to allow lines 61 and a gate to subsist above the two appendices 53, 57 (in dashes in FIG. 3).

The particular shape of appendix 57 eliminates the spurious transistor which could exist between appendix 53 and the following column.

Figure 4:
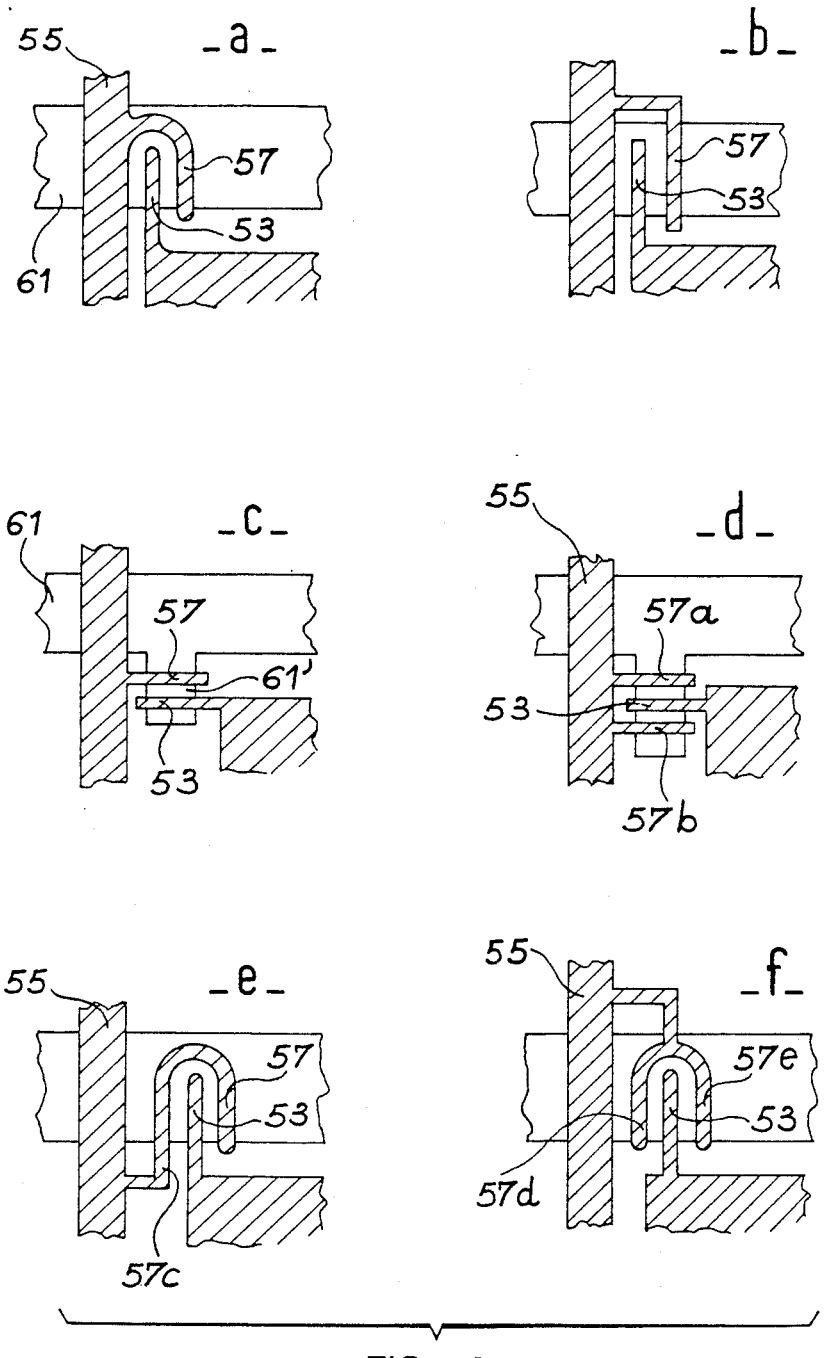

The arrangement represented in FIG. 3 is only diagrammatic. FIG. 4 illustrates several possible embodiments for segments 53 and 57.

On part (a) of FIG. 4, it is first of all seen that segment 57 goes beyond the lower edge of line 61, which totally eliminates the lines of stray current. Moreover, segment 57 comprises a semicircular part which surrounds the end of segment 53. Thus, all current is interrupted between source 53 and the column which is on the right of column 55.

On part (b), segment 57 comprises two parts forming a right angle, segment 53 being inserted between this corner and the column.

On part (c), line 61 comprises an appendix 61' directed perpendicular to the direction of the line. The two segments 53 and 57 are parallel, segment 57 passing through both sides of appendix 61'

On part (d), the drain segment is in fact composed of two segments 57a and 57b, source segment 53 placed between the two.

On part (e), segment 57 ends by a form similar to that of part (a) but it is connected to the column by a part 57c in the form of a rectangular wedge.

Finally, on part (f), segment 57 ends with a fork having two legs 57d and 57e.

Obviously, numerous modifications and variations of the present invention are possible in light of the above teachings. It is therefore to be understood that within the scope of the appended claims, the invention may be practiced otherwise than as specifically described herein.

What is claimed as new and desired to be secure by Letters Patent of the United States is:

1. Active matrix display screen comprising:
    (a) a first insulating and transparent wall coating with:
        (i) a matrix of blocks distributed in lines and columns, these blocks being of transparent conductive material and forming pixels, each block being connected to a first conductive segment,
        (ii) a family of conductive addressing columns placed between the columns of blocks, each column being provided with at least a second conductive segment at the level of each pixel, each second segment connected to a determined column having a part which is interposed between the first segment connected to the block and the column which follows said determined column,
        (iii) a family of conductive addressing lines perpendicular to the addressing columns and placed between the lines of blocks, these lines consisting of a stack of a semiconductive material, these lines covering said first segments connected to the conductive blocks and said second segments connected to the columns, a matrix of transistors thus being constituted there where the lines cover said first and second segments, each transistor of this matrix comprising a gate formed by the conductive layer of a line, a source formed by the first segment connected to the block and a drain formed by the second segment connected to a column,
    (b) a second insulating and transparent wall coated with a transparent conductive layer,
    (c) a layer of liquid crystal inserted between the first and the second wall.

2. Display screen according to claim 1, in which each second segment comprises a semicircular part surrounding the end of the first segment 3. Display screen according to claim 1, in which each second segment comprises two parts forming a right angle, the first segment being placed between a column and this right angle.

4. Display screen according to claim 1, in which each addressing line comprises, at the level of each pixel, an appendix in a direction perpendicular to the direction of the line, the first and the second segments being rectilinear and parallel to the lines and overlapping this appendix.

5. Display screen according to claim 4, in which the second segment is composed of two segments parallel to the lines framing the first segment.

* * * * *